(12) United States Patent
Xie et al.

(10) Patent No.: US 9,542,991 B1
(45) Date of Patent: Jan. 10, 2017

(54) SINGLE-ENDED SIGNAL EQUALIZATION WITH A PROGRAMMABLE 1-TAP DECISION FEEDBACK EQUALIZER

(71) Applicant: Integrated Device Technology, Inc., San Jose, CA (US)

(72) Inventors: Yi Xie, Shanghai (CN); HaiQi Liu, Shanghai (CN)

(73) Assignee: INTEGRATED DEVICE TECHNOLOGY, inc., San Jose, CA (US)

( * ) Notice: Subject to any disclaimer, the term of this patent is extended or adjusted under 35 U.S.C. 154(b) by 0 days.

(21) Appl. No.: 15/079,370

(22) Filed: Mar. 24, 2016

(30) Foreign Application Priority Data

Mar. 21, 2016 (CN) .......................... 2016 1 0160111

(51) Int. Cl.
| | |
|---|---|
| *G11C 5/14* | (2006.01) |
| *G11C 11/4091* | (2006.01) |
| *G11C 11/4076* | (2006.01) |
| *G11C 11/4093* | (2006.01) |
| *G11C 11/4074* | (2006.01) |

(52) U.S. Cl.
CPC ........ *G11C 11/4091* (2013.01); *G11C 11/4076* (2013.01); *G11C 11/4093* (2013.01); *G11C 5/145* (2013.01); *G11C 5/147* (2013.01); *G11C 11/4074* (2013.01)

(58) Field of Classification Search
CPC ....... G11C 5/147; G11C 5/145; G11C 11/4074
USPC .......................... 365/189.09, 230.06, 189.07
See application file for complete search history.

(56) References Cited

U.S. PATENT DOCUMENTS 7,505,332 B1 * 3/2009 Talbot .................. H04L 1/0045
365/189.09

* cited by examiner

*Primary Examiner* — Jason Lappas
(74) *Attorney, Agent, or Firm* — Christopher P. Maiorana P.C.

(57) ABSTRACT

An apparatus includes a first circuit and a second circuit. The first circuit may be configured to (i) receive a sequence of input values that have been carried on a single-ended line of a data bus coupled to a memory channel, (ii) slice a previous input value of said sequence of input values to generate a previous output value, (iii) slice a current input value of said sequence of input values to generate a current output value, and (iv) present said current output value on a differential line. The previous input value generally precedes said current input value in said sequence of input values. The second circuit may be configured to decode said previous input value based on a tap coefficient value to generate a plurality of feedback values suitable to reduce an inter-symbol interference in said current input value caused by said previous input value.

20 Claims, 7 Drawing Sheets

SINGLE-ENDED SIGNAL EQUALIZATION WITH A PROGRAMMABLE 1-TAP DECISION FEEDBACK EQUALIZER

This application relates to Chinese Application No. 201610160111.8, filed Mar. 21, 2016, which is hereby incorporated by reference in its entirety.

FIELD OF THE INVENTION

The invention relates to signal equalization generally and, more particularly, to a method and/or apparatus for implementing a single-ended signal equalization with a programmable 1-tap decision feedback equalizer.

BACKGROUND

Conventional interfaces of DDR4 SDRAM (double data rate fourth generation synchronous dynamic random-access memory) operate at data rates of up to 3.2 gigabits per second. Channel degradation can cause a data eye at a receiver side of the interface can be closed. Dielectric and resistive losses of printed-circuit-board traces contribute to the channel degradation. The traces present frequency dependent attenuations that cause pulse dispersions and inter-symbol interference (ISI). Impedance discontinuities from connectors and via stubs in the signal path cause reflections that generate more ISI and further reduce a signal-to-noise ratio. As the data rate of a DDR4 SDRAM is increased, the channel loss and the reflections become significant.

It would be desirable to implement a single-ended signal equalization with a programmable 1-tap decision feedback equalizer.

SUMMARY

The invention concerns an apparatus including a first circuit and a second circuit. The first circuit may be configured to (i) receive a sequence of input values that have been carried on a single-ended line of a data bus coupled to a memory channel, (ii) slice a previous input value of the sequence of input values to generate a previous output value, (iii) slice a current input value of the sequence of input values to generate a current output value, and (iv) present the current output value on a differential line. The previous input value generally precedes the current input value in the sequence of input values. The second circuit may be configured to decode the previous input value based on a tap coefficient value to generate a plurality of feedback values suitable to reduce an inter-symbol interference in the current input value caused by the previous input value.

BRIEF DESCRIPTION OF THE DRAWINGS

Embodiments of the invention will be apparent from the following detailed description and the appended claims and drawings in which:

DETAILED DESCRIPTION OF THE EMBODIMENTS

Embodiments of the invention include providing a single-ended signal equalization with a programmable 1-tap decision feedback equalizer that may (i) have a small propagation delay, (ii) have small to no static power costs, (iii) reduce or eliminate inter-symbol interference, (iv) compensate for channel loss and reflection, (v) operate on single-ended signals, (vi) be programmable to cover different length of channels, (vii) be implemented in memory interfaces and/or (viii) be implemented within an integrated circuit.

Various embodiments of the invention generally provide a programmable 1-tap decision feedback equalizer (DFE) circuit. The 1-tap DFE circuit may be implemented in a register clock driver circuit of a DDR4 module. The 1-tap DFE circuit may be integrated in a data sampling stage for channel equalization to compensate for channel losses and reflections without introducing extra propagation delay. A programmability of the 1-tap DFE circuit may help to cover different length of channels.

Figure 1:
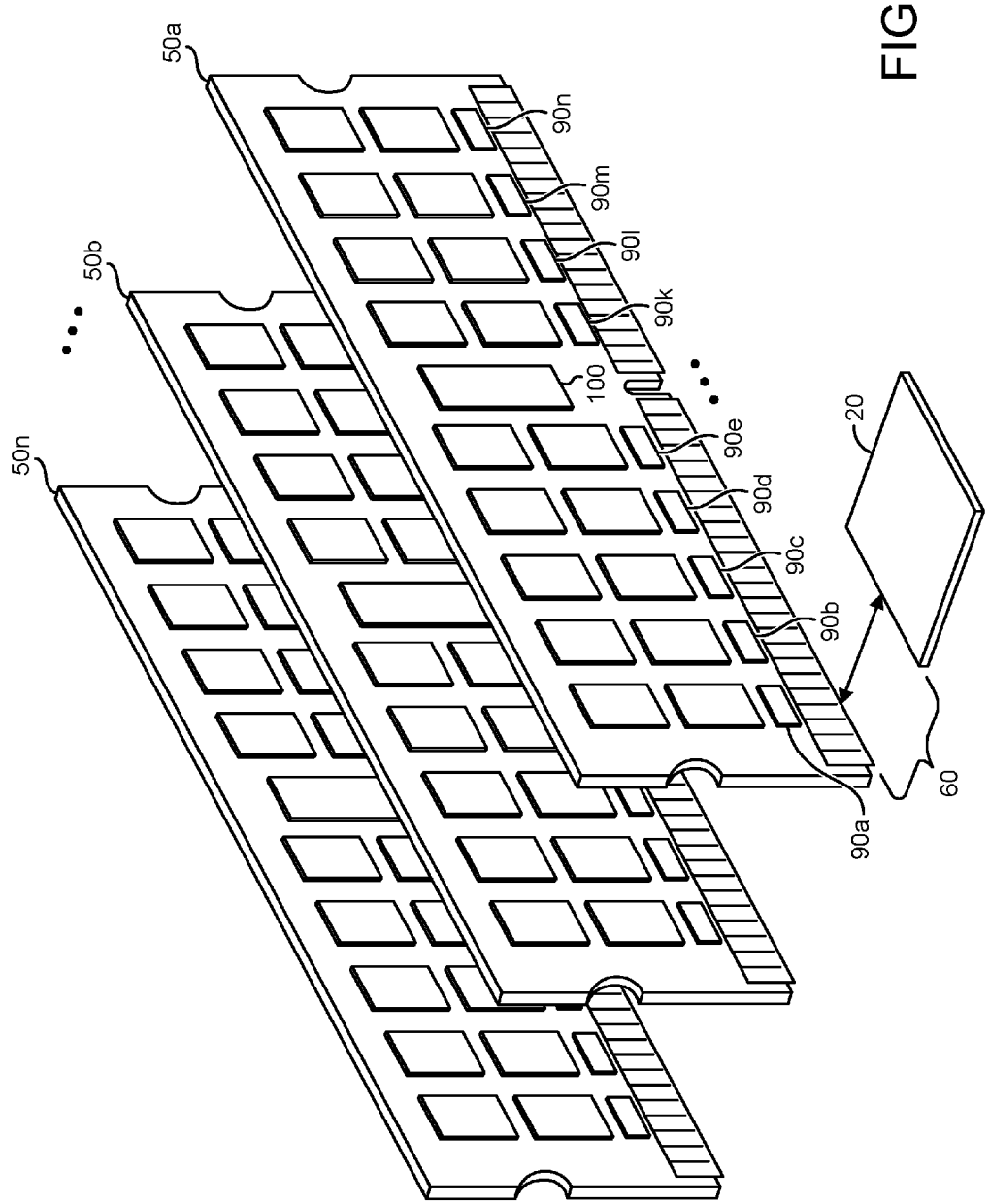
FIG. 1 is a diagram illustrating multiple memory modules.

Referring to FIG. 1, a diagram illustrating a number of example circuits 50a-50n are shown. In an example, circuits 50a-50n may be implemented as memory modules (or boards). For example, the memory modules 50a-50n may be implemented as double data rate fourth generation (DDR4) synchronous dynamic random-access memory (SDRAM) modules. The memory modules 50a-50n may comprise a number of blocks (or circuits) 90a-90n, a block (or circuit) 100, and/or various other blocks, circuits, pins, connectors and/or traces. The circuits 90a-90n may be configured as data buffers. The circuit 100 may be implemented as a registered clock driver (RCD). In an example, the RCD circuit 100 may be implemented as a DDR4 RCD circuit. The type, arrangement and/or number of components of the memory modules 50a-50n may be varied to meet the design criteria of a particular implementation.

The memory modules 50a-50n are shown connected to a block (or circuit) 20. The circuit 20 may be a memory controller. The circuit 20 may be located in another device, such as a computing engine. Various connectors/pins/traces 60 may be implemented to connect the memory modules 50a-50n to the memory controller 20. In some embodiments, the connectors/pins/traces 60 may be a 288-pin configuration. In an example, the memory controller 20 may be a component of a computer motherboard. In another example, the memory controller 20 may be a component of a microprocessor. In yet another example, the memory controller 20 may be a component of a central processing unit (CPU).

In an example, some of the connectors/pins/traces 60 may be part of the memory modules 50a-50n and some of the connectors/pins/traces 60 may be part of the motherboard and/or memory controller 20. The memory modules 50a-50n may be connected to a computer motherboard (e.g., by pins, traces and/or connectors 60) to transfer data between components of a computing device and the memory modules 50a-50n. In an example, the memory controller 20 may be implemented on a northbridge of a motherboard and/or as a component of a microprocessor (e.g., an Intel CPU, an AMD CPU, an ARM CPU, etc.). The implementation of the memory controller 20 may be varied according to the design criteria of a particular implementation.

In various embodiments, the memory modules 50a-50n may be DDR4 SDRAM memory modules. The DDR4 SDRAM memory modules 50a-50n may have a memory module density of 512 gigabyte (GB), terabyte, or higher per module (e.g., compared to 128 GB per dual in-line memory module (DIMM) in DDR3). The DDR4 SDRAM memory modules 50a-50n may operate at voltages of 1.2-1.35 volts (V) with a frequency between 800-2133 megahertz (MHz) (e.g., compared to 1.5-1.65V at frequencies between 400-1067 MHz in DDR3). In some embodiments, the memory modules 50a-50n may be implemented as low voltage DDR4 and operate at 1.05V. For example, the DDR4 SDRAM memory modules 50a-50n may implement 35% power savings compared to DDR3 memory. The DDR4 SDRAM memory modules 50a-50n may transfer data at speeds of 2.13-4.26 giga-transfers per second (GT/s) and higher (e.g., compared to 0.8-2.13 GT/s in DDR3). The operating parameters of the memory modules 50a-50n may be varied according to the design criteria of a particular implementation.

In an example, the memory modules 50a-50n may be compliant with the DDR4 specification titled "DDR4 SDRAM", specification JESD79-4A, November 2013, published by the Joint Electron Device Engineering Council (JEDEC) Solid State Technology Association, Arlington, Va. Appropriate sections of the DDR4 specification are hereby incorporated by reference in their entirety.

The memory modules 50a-50n may be implemented as DDR4 load reduced DIMM (LRDIMM) or DDR4 registered DIMM (RDIMM). The data buffers 90a-90n may allow the memory modules 50a-50n in a DDR4 LRDIMM configuration to operate at higher bandwidth and/or at higher capacities compared to DDR4 RDIMM (e.g., 1333 MT/s for DDR4 LRDIMM compared to 1067 MT/s for DDR4 RDIMM at 384 GB capacity). For example, compared to DDR4 RDIMM configurations, the DDR4 LRDIMM configuration of the memory modules 50a-50n may allow improved signal integrity on data signals, lower component latency through the data buffers 90a-90n and/or better intelligence and/or post-buffer awareness by the memory controller 20.

Figure 2:
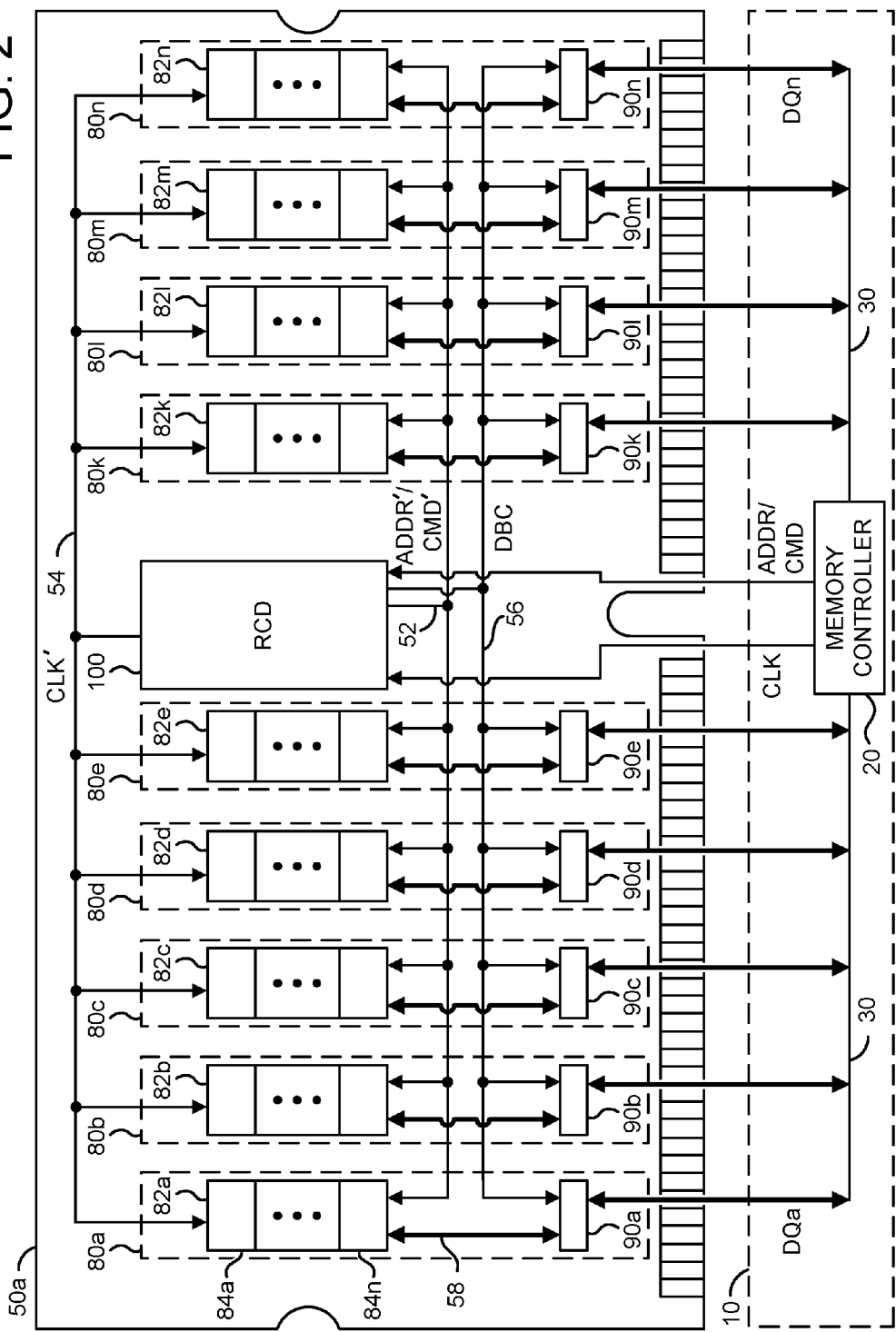
FIG. 2 is a block diagram illustrating a memory module.

Referring to FIG. 2, a block diagram illustrating a memory module 50a is shown. The memory module 50a may be representative of the memory modules 50b-50n. The memory module 50a is shown communicating with the memory controller 20. The memory controller 20 is shown as part of a block (or circuit) 10. The circuit 10 may be a motherboard, or other electronic component or computing engine that communicates with the memory module 50a.

The memory module 50a may comprise one or more blocks (or circuits) 80a-80n and/or the RCD circuit 100. The circuits 80a-80n may implement data paths of the memory module 50a. For example, the data path 80a may include the blocks 82a and/or the data buffer 90a. The data paths 80b-80n may have a similar implementations. The circuits 82a-82n may each be implemented as a memory channel. Each of the memory channels 82a-82n may comprise a number of blocks (or circuits) 84a-84n. The circuits 84a-84n may be implemented as random access memory (RAM) chips. For example, the RAM chips 84a-84n may implement a volatile memory such as dynamic RAM (DRAM). In some embodiments, the RAM chips 84a-84n may be physically located on both sides (e.g., the front and back) of the circuit board of the memory modules 50a-50n. A capacity of memory on the memory module 50a may be varied according to the design criteria of a particular implementation.

The memory controller 20 may generate a signal (e.g., CLK) and a number of control signals (e.g., ADDR/CMD). The signal CLK and/or the signals ADDR/CMD may be presented to the RCD circuit 100. A data bus 30 may be connected between the memory controller and the data paths 80a-80n. The memory controller 20 may generate and/or receive data signals (e.g., DQa-DQn) that may be presented/received from the data bus 30. The signals DQa-DQn may be presented to each of the data paths 80a-80n.

The RCD circuit 100 may be configured to communicate with the memory controller 20, the memory channels 82a-82n and/or the data buffers 90a-90n. The RCD circuit 100 may decode instructions received from the memory controller 20. For example, the RCD circuit 100 may receive register command words (RCWs). In another example, the RCD circuit 100 may receive buffer control words (BCWs). The ROD circuit 100 may be configured to train the DRAM chips 84a-84n, the data buffers 90a-90n and/or command and address lines between the memory controller 20. For example, the RCWs may flow from the memory controller 20 to the RCD circuit 100. The RCWs may be used to configure the RCD circuit 100.

The RCD circuit 100 may be used in both LRDIMM and RDIMM configurations. The ROD circuit 100 may implement a 32-bit 1:2 command/address register. The ROD circuit 100 may support an at-speed bus (e.g., a BOOM bus between the RCD circuit 100 and the data buffers 90a-90n). The RCD circuit 100 may implement automatic impedance calibration. The RCD circuit 100 may implement command/address parity checking. The RCD circuit 100 may control register RCW readback. The RCD circuit 100 may implement a 1 MHz inter-integrated circuit ($I^2C$) bus (e.g., a serial bus). Inputs to the RCD circuit 100 may be pseudo-differential using external and/or internal voltages. The clock outputs, command/address outputs, control outputs and/or data buffer control outputs of the RCD circuit 100 may be enabled in groups and independently driven with different strengths.

The RCD circuit 100 may receive the signal CLK and/or the signals ADDR/CMD from the memory controller 20. Various digital logic components of the RCD circuit 100 may be used to generate signals based on the signal CLK and/or the signals ADDR/CMD and/or other signals (e.g., RCWs). The RCD circuit 100 may also be configured to generate a signal (e.g., CLK') and signals (e.g., ADDR'/CMD'). For example, the signal CLK' may be a signal Y_CLK in the DDR4 specification. The signal CLK' and/or the signals ADDR'/CMD' may be presented to each of the memory channels 82a-82n. For example, the signals CLK' and/or ADDR'/CMD' may be transmitted on a common bus 54. The RCD circuit 100 may generate one or more signals (e.g., DBC). The signals DBC may be presented to the data buffers 90a-90n. The signals DBC may be transmitted on a common bus 56 (e.g., a data buffer control bus).

The data buffers 90a-90n may be configured to receive data from the bus 56. The data buffers 90a-90n may be configured to generate/receive data to/from the bus 30. The bus 30 may comprise traces, pins and/or connections between the memory controller 20 and the data buffers 90a-90n. A bus 58 may carry the data between the data buffers 90a-90n and the memory channels 82a-82n. The data buffers 90a-90n may be configured to buffer data on the buses 30 and 58 for write operations (e.g., data transfers from the memory controller 20 to the corresponding memory channels 82a-82n). The data buffers 90a-90n may be configured to buffer data on the buses 30 and 58 for read operations (e.g., data transfers from the corresponding memory channels 82a-82n to the memory controller 20).

The data buffers 90a-90n may exchange data with the DRAM chips 84a-84n in small units (e.g., 4-bit nibbles). In various embodiments, the DRAM chips 84a-84n may be arranged in multiple (e.g., two) sets. For two set/two DRAM chip 84a-84b implementations, each set may contain a single DRAM chips 84a-84n. Each DRAM chip 84A-84b may be connected to the respective data buffers 90a-90n through an upper nibble and a lower nibble. For two set/four DRAM chip 84a-84d implementations, each set may contain two DRAM chips 84a-84d. A set may be connected to the respective data buffers 90a-90n through the upper nibble. The other set may be connected to the respective data buffers 90a-90n through the lower nibble. For two set/eight DRAM chip 84a-84h implementations, each set may contain four of the DRAM chips 84a-84h. A set of four DRAM chips 84a-84d may connect to the respective data buffers 90a-90n through the upper nibble. The other set of four DRAM chips 84e-84h may connect to the respective data buffers 90a-90n through the lower nibble. Other numbers of sets, other numbers of DRAM chips, and other data unit sizes may be implemented to meet the design criteria of a particular implementation.

The DDR4 LRDIMM configuration may reduce a number of data loads to improve signal integrity on a data bus (e.g., the bus 30) of the memory module from a maximum of several (e.g., four) data loads down to a single data load. The distributed data buffers 90a-90n may allow DDR4 LRDIMM designs to implement shorter I/O trace lengths compared to DDR3 LRDIMM designs, that use a centralized memory buffer. For example, shorter stubs connected to the memory channels 82a-82n may result in less pronounced signal reflections (e.g., improved signal integrity). In another example, the shorter traces may result in a reduction in latency (e.g., approximately 1.2 nanoseconds (ns), that is 50% less latency than DDR3 buffer memory). In yet another example, the shorter traces may reduce I/O bus turnaround time. For example, without the distributed data buffers 90a-90n (e.g., in DDR3 memory applications) traces would be routed to a centrally located memory buffer, increasing trace lengths up to six inches compared to the DDR4 LRDIMM implementation shown in FIG. 2.

In some embodiments, the DDR4 LRDIMM configuration may implement nine of the data buffers 90a-90n. The memory modules 50a-50n may implement 2 millimeter (mm) frontside bus traces and backside traces (e.g., the connectors/pins/traces 60). A propagation delay through the data buffers 90a-90n may be 33% faster than through a DDR3 memory buffer (e.g., resulting in reduced latency). In some embodiments, the data buffers 90a-90n may be smaller (e.g., a reduced area parameter) than a data buffer used for DDR3 applications.

Figure 3:
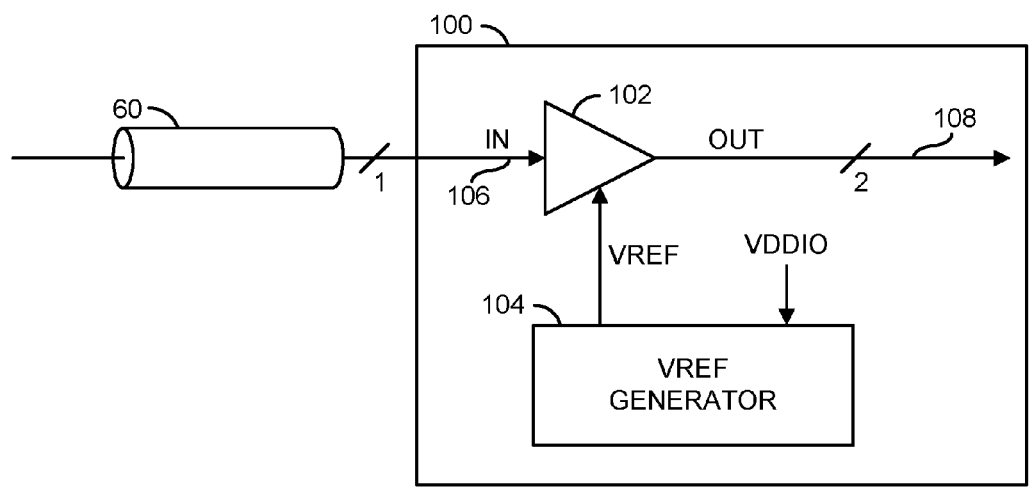
FIG. 3 is a block diagram of a receiver portion of a register buffer receiver circuit.

Referring to FIG. 3, a block diagram of a receiver portion of the RCD circuit 100 is shown in accordance with a embodiment of the present invention. The receiver portion generally comprises an equalization block (or circuit) 102 and reference voltage generator block (or circuit) 104.

An input signal (e.g., IN) may be received by the circuit 102 from the connectors/pins/traces 60. In various embodiments, the signal IN may represent any of the commands in the signal CMD, the addresses in the signal ADDR and/or other information transferred from the memory controller 20 to the RCD circuit 100. An input/output voltage (or power) domain (e.g., VDDIO) may be received by the circuit 104. The circuit 104 may generate a reference signal (e.g., VREF) presented to the circuit 102. The signal VREF may convey a fixed reference voltage. An output signal (e.g., OUT) may be generated by the circuit 102. The signal OUT may carry an equalized version of the information bits (or pulses) received in the signal IN. The signal OUT may be implemented as a differential signal.

The circuit 102 may implement a decision feedback equalization (DFE) circuit. The DFE circuit 102 may be operational to convert the single-ended signal IN into the differential signal OUT. Within the DFE circuit 102, prior bit decisions are generally used and subtracted in a feedback loop. The DFE circuit 102 may subtract a post-cursor or a pre-cursor inter-symbol interference without amplifying high-frequency noise or cross-talk and so may achieve better signal-to-noise ratio than other equalization techniques. To minimize the power consumption, the DFE circuit 102 may implement a 1-tap direct-feedback DFE operation.

The 1-tap DFE circuit 102 generally implements a transfer function per formula 1 as follows:

$$D(i)=D(N)+K\text{tap}\times D(N-1) \qquad (1)$$

where D(N) may be an analog input at a sample time N, D(i) may be a digitized input at the sample time N, D(N−1) may be a preceding digitized data bit, and Ktap may be a tap coefficient. The tap coefficient Ktap is generally determined by specific channel characteristics of the connectors/pins/traces 60. The resulting inter-symbol interference may be subtracted from the current analog input D(N).

The DFE circuit 102 may be used in multi-drop single-ended applications for channel equalization. The 1-tap direct-feedback DFE operation may be suitable for DDR4 memory interface applications where a short propagation delay (e.g., less than 40 picoseconds) may be helpful to maintain a tight timing budget. The DFE circuit 102 may be implemented with core transistors (e.g., NMOS transistors) as input devices to achieve a small set-up time and ck-q delay. Voltage levels in the differential signal OUT generated by the DFE circuit 102 generally do not exceed a maximum operating voltage of a core voltage domain VDDC (e.g., 0.9 volts) used by the core transistors.

The DFE circuit 102 generally eliminates a use of a preceding continuous-time linear equalizers (CTLE) and/or a limiting amplifiers (LA) on the input signal. The lack of CTLE and LA circuitry reduces propagation delay introduced into the timing path compared to common designs. The DFE circuit 102 may be configured to improve a data eye height and improve width shmoo results for the information in the signal IN. Because the information in the signal IN and the reference voltage signal VREF comes from the input/output voltage domain VDDIO (e.g., 1.2 volts), the DFE circuit 102 is generally placed under the input/output voltage domain VDDIO. The DFE circuit 102 is generally configured to create a suitable voltage swing in the differential signal OUT.

The circuit 104 may implement a reference voltage (VREF) generation circuit. The VREF circuit 104 may be operational to provide a fixed reference voltage in the signal VREF to multiple (e.g., up to 33) copies of the DFE circuit 102. In some embodiments, the signal VREF may be generated as a fraction (e.g., half) of the input/output voltage domain VDDIO. Other reference voltages may be generated to meet the design criteria of a particular implementation. In various embodiments, multiple instantiations of the reference voltage generator circuit 104 may be implemented based on the number of the DFE circuits 102 that consume the signal VREF.

Figure 4:
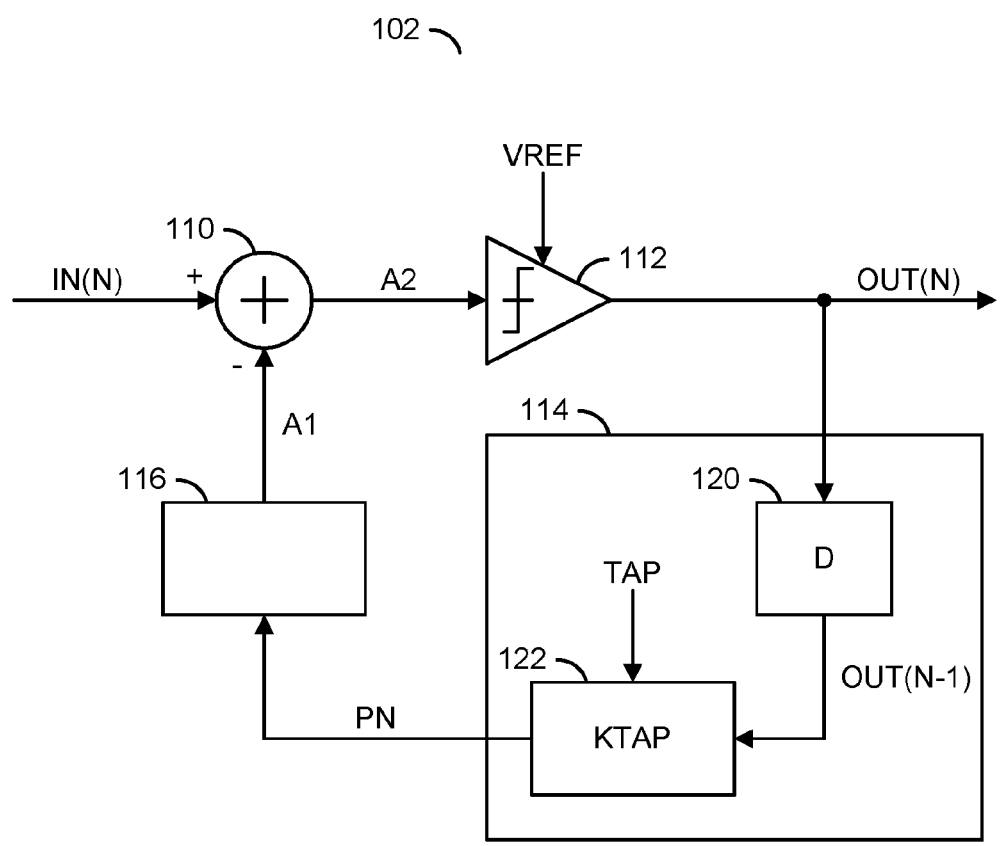
FIG. 4 is a block diagram of a decision feedback equalizer circuit.

Referring to FIG. 4, a block diagram of an example implementation of the DFE circuit 102 is shown. The DFE circuit 102 generally comprises a block (or circuit) 110, a block (or circuit) 112, a block (or circuit) 114 and a block (or circuit) 116. The circuit 114 generally comprises a block (or circuit) 120 and a block (or circuit) 122.

The signal IN may be received by the circuit 110. The circuit 110 may receive a signal (e.g., A1) from the circuit 116. The signal A1 may transfer an equalization value (or correction data) used to adjust the data in the signal IN. A signal (e.g., A2) may be generated by the circuit 110 and transferred to the circuit 112. The signal A2 may carry a difference between the signal IN and the signal A1. The circuit 112 may generate the signal OUT. The signal OUT may be received by the circuit 120. The circuit 120 may generate a delayed version of the signal OUT(N) (e.g., OUT(N−1)). The signal OUT(N−1) may be received by the circuit 122. A signal (e.g., TAP) may be received by the circuit 122. The signal TAP may carry a multiplication value. The circuit 122 may generate a signal (e.g., PN). The signal PN may provide correction information for the data in the signal IN. The signal PN may be received by the circuit 116.

The circuit 110 may implement a summation circuit. The circuit 110 is generally operational to sum an inverse of the data in the signal A1 to the signal IN to generate the signal A2. The addition of the inverse data (subtraction of the data) in the signal A1 generally subtracts a post-cursor or a pre-cursor inter-symbol interference (ISI) from the data in the signal IN.

The circuit 112 may implement a slicer circuit. The slicer circuit 112 may be operational to convert the single-ended signal A2 into the differential signal OUT based on a reference voltage received in the signal VREF. The signal OUT may carry a shaped version of the information received in the signal A2. The shaping generally retains level portions of the information that represent nominal values of the information in intervals between consecutive transitions.

The circuit 114 may implement a DFE decoder circuit. The DFE decoder circuit 114 is generally operational to delay samples received in the signal OUT and multiply the delayed samples by a multiplication factor. A resulting product of the multiplication may be used to generate multiple control values in the signal PN.

The circuit 116 may implement an amplifier circuit. The amplifier circuit 116 is generally operational to generate the signal A1 based on the control values received in the signal PN. In various embodiments, the control values in the signal PN may be used to control a pair of current values in the signal A1.

The circuit 120 may implement a delay circuit. The delay circuit 120 is generally operational to delay (or buffer) periodic samples of the signal OUT. During a sample time N, the delay circuit 120 may store and present a previous sample of the signal OUT taken at a previous time N−1. While the slicer circuit 112 presents the signal OUT(N) during the sample time N, the delay circuit 120 generally presents the signal OUT(N−1) during the sample time N.

The circuit 122 may implement a K-tap circuit. The K-tap circuit 122 is generally operational to multiple the samples in the signal OUT(N−1) by a multiplication value received in the signal TAP. In various embodiments, the K-tap circuit 122 may implement a single-tap circuit (e.g., K=1). A product of the multiplication value and the delayed sample may control generation of the control values in the signal PN.

Figure 5:
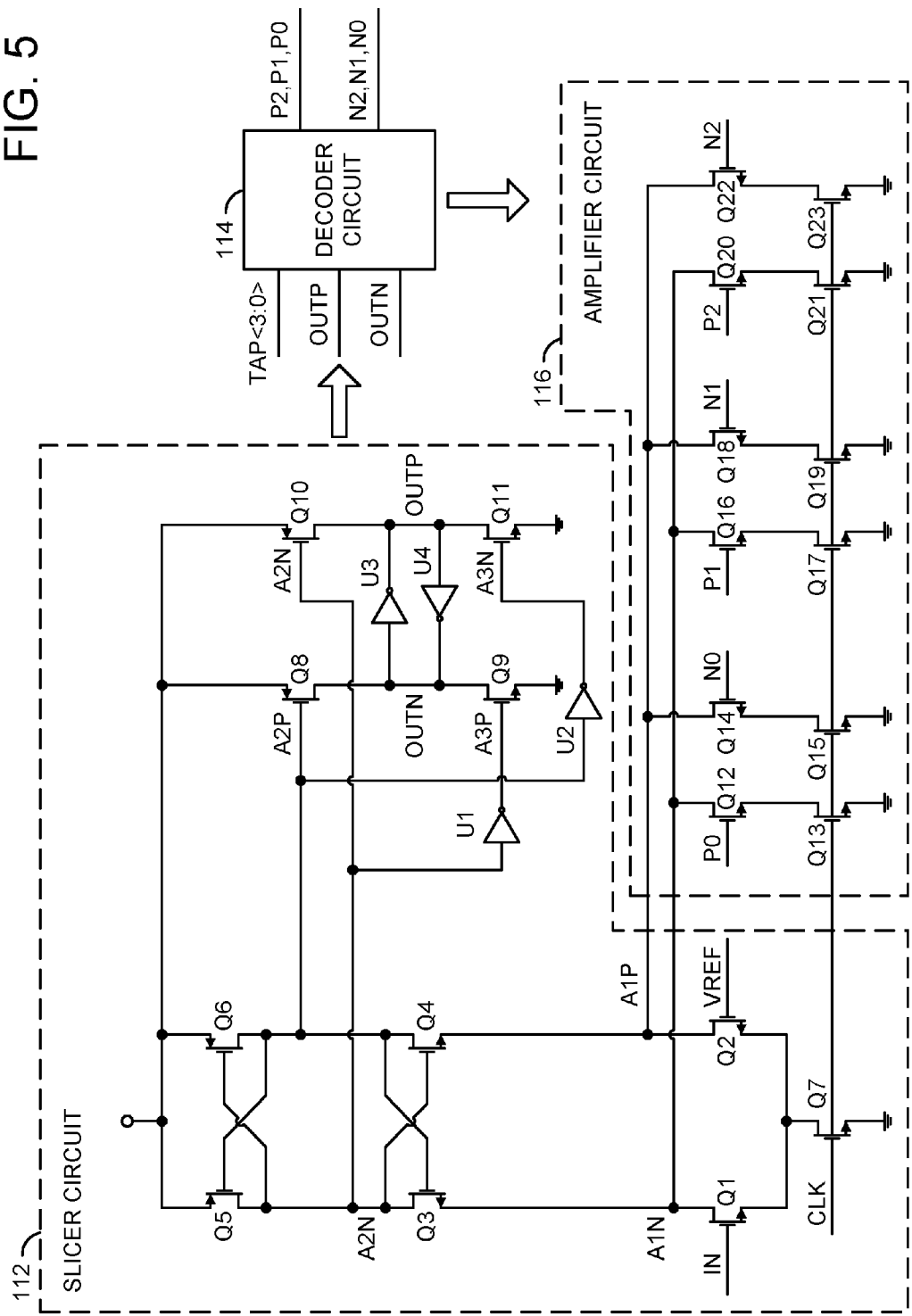
FIG. 5 is a schematic diagram of the decision feedback equalizer circuit.

Referring to FIG. 5, a schematic diagram of an example implementation of the DFE circuit 102 is shown. The DFE circuit 102 generally integrates the summation circuit 110 into the sampling slicer circuit 112. A prior data bit may be sampled by the slicer circuit 112 and transferred to the DFE decoder circuit 114. The DFE decoder circuit 114 generally realizes the DFE function with a programmable weight coefficient in the signal TAP. A series of input-like branches in the signal A1 may be connected in parallel with a main-tap input pair of the slicer circuit 112 to implement a negative summation of the current received in the signals IN/VREF and the feedback signal A1.

A setup time for a low to high transition of the DFE circuit 102 may be approximately 24 to 25 picoseconds (ps). A setup time for a high to low transition may be approximately 26 to 27 ps. The set up times were estimated with the input/output voltage domain VDDIO at 1.2 volts, the core voltage domain VDDC at 0.875 volts and at 25 degrees Celsius.

The slicer circuit 112 generally receives the analog input value in the signal IN and the reference input value in the signal VREF. The signal A1 may be implemented as a differential pair of signals (e.g., A1N and A1P). The signals A1N and A1P generally connect the slicer circuit 112 to the amplifier circuit 116. The signal A2 may be implemented as a differential pair of output signals (e.g., A2N and A2P). The signals A2N and A2P may be routed internal to the slicer circuit 112. The slicer circuit 112 may generate a differential signal (e.g., A3N and A3P) used internally. The signal OUT may be generated by the slicer circuit 112 as a differential pair of signals (e.g., OUTN and OUTP).

The signals OUTN and OUTP may be received by the DFE decoder circuit 114. The signal TAP may be received by the DFE decoder circuit 114. The signal PN may be implemented as multiple control signals (e.g., N0, N1, N2, P0, P1 and P2). The control signals N0, N1, N2, P0, P1 and P2 may connect the DFE decoder circuit 114 to the amplifier circuit 116. The clock signal CLK may be received by the summation circuit 110 and the amplifier circuit 116. The signal CLK may be used to distinguish among the sampling periods (e.g., N−2, N−1, N, N+1 N+2, etc.)

The slicer circuit 112 generally comprises multiple transistors Q1 to Q11 and several inverters U1-U4. In various embodiments, the transistors Q1 to Q4, Q7, Q9 and Q11 may be implemented as NMOS transistors. The transistors Q5, Q6, Q8 and Q10 may be implemented as PMOS transistors. Other transistor types may be implemented to meet the design criteria of a particular application. Two of the inverters (U1 and U2) may invert the signals A2N and A2P to generate the signals A3P and A3N, respectively. Two other inverters (U3 and U4) may be arranged as a latch.

The transistors Q1 to Q6 may be arranged as a differential amplifier. The signal IN may be received by a gate of the transistor Q1. The signal A1N may be connected to a node that connects a drain of the transistor Q1 to a source of the transistor Q3. The signal A2N may be connected to a node that connects a drain of the transistor Q3 to a source of the transistor Q5.

The signal VREF may be received by a gate of the transistor Q2. The signal A1P may be connected to a node that connects a drain of the transistor Q2 to a source of the transistor Q4. The signal A2P may be connected to a node that connects a drain of the transistor Q4 to a source of the transistor Q6.

The sources of the transistors Q1 and Q2 may be connected to a drain of the transistor Q7. A gate of the transistor Q7 may receive the signal CLK. A source of the transistor Q7 may be connected to a signal ground.

The gates of the transistors Q3 and Q4 may be cross-coupled to the opposite sources. The gates of the transistors Q5 and Q6 may be cross-coupled to the opposite sources. The drains of the transistors Q3 and A4 may be connected to the respective sources of the transistors Q5 and Q6. The drains of the transistors Q5 and Q6 may be connected to the core voltage domain VDDC.

A gate of the transistor Q8 may receive the signal A2P. A gate of the transistor Q9 may receive the signal A3P. The transistors Q8 and Q9 may be configured to pull up and pull down, respectively, an end of the latch that generates the signal OUTN. A gate of the transistor Q10 may receive the signal A2N. A gate of the transistor Q11 may receive the signal A3N. The transistors Q10 and Q11 may be configured to pull up and pull down, respectively, the other end of the latch that generates the signal OUTP.

The amplifier circuit 116 generally comprises multiple transistors Q12 to Q23. In various embodiments, the transistors Q12 to 2Q3 may be implemented as NMOS transistors. Other transistor types may be implemented to meet the design criteria of a particular application.

The transistors Q12 and Q14 may be configured as a differential pair of pull down transistors controlled by the signals P0 and N0, respectively. The transistors Q16 and Q18 may be configured as a differential pair of pull down transistors controlled by the signals P1 and N1, respectively. The transistors Q20 and Q22 may be configured as a differential pair of pull down transistors controlled by the signals P2 and N2, respectively. Drains of the transistors Q12, Q16 and Q20 may be connected together to generate the signal A1N. Drains of the transistors Q142, Q18 and Q22 may be connected together to generate the signal Alp. Gates of the transistors Q13 to Q23 may receive the signal CLK.

The transistors Q13 and 15 may selectively couple the transistors Q12 and Q14 to the signal ground based on the signal CLK. The transistors Q17 and 19 may selectively couple the transistors Q16 and Q18 to the signal ground based on the signal CLK. The transistors Q21 and 23 may selectively couple the transistors Q20 and Q22 to the signal ground based on the signal CLK. A size of the transistors Q12 to Q23 may be designed with different weights so as to realize the DFE programmability.

Figure 6:
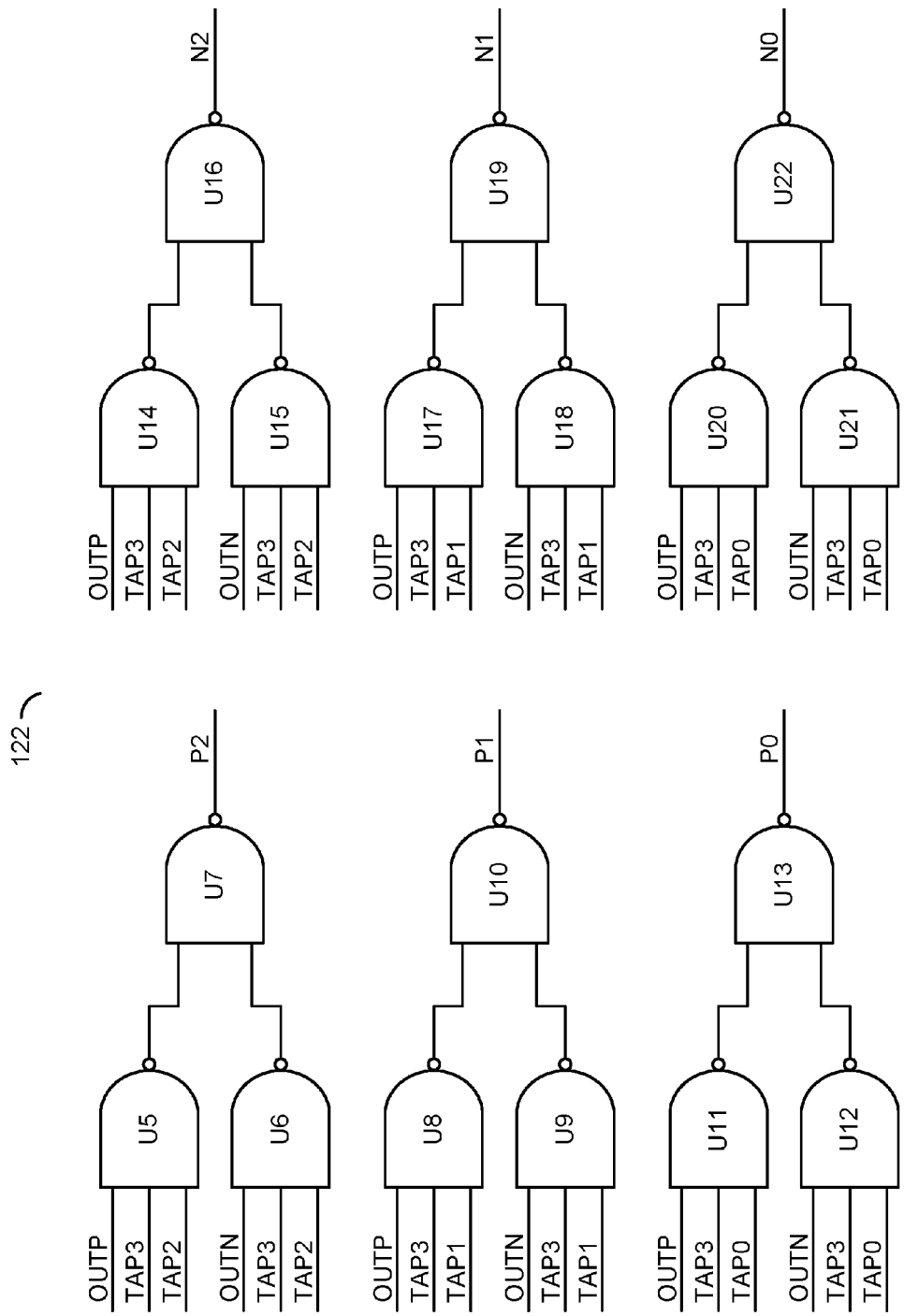
FIG. 6 is a schematic diagram of a K-tap circuit.

Referring to FIG. 6, a schematic diagram of an example implementation of the K-tap circuit 122 is shown. The K-tap circuit 122 generally comprises multiple logic gates U5 to U22. In various embodiments, the logic gates U5 to U22 may implement Boolean NAND gates.

The gates may be arranged in sets of three gates, U5 to U7, U8 to U10, U11 to U13, U14 to U16, U17 to U19, and U20 to U22. Two input gates in each 3-gate set (e.g., the input gates U5 and U6, U8 and U9, U11 and U12, etc.) may be implemented as three-input NAND gates. Each input gate may receive two components (e.g., TAP0, TAP1, TAP2 and TAP3) from the signal TAP and either the signal OUTP or the signal OUTN. An output gate in each 3-gate set (e.g., the output gates U7, U10, etc.) may by implemented as two-input NAND gates. Each output gate may receive an output signal from each of the two corresponding input gates. Each output gate may generate a respective signal P0, P1, P2, N0, N1 and N2. Other designs of the K-tap circuit 122 may be implemented to meet the design criteria of a particular application.

Figure 7:
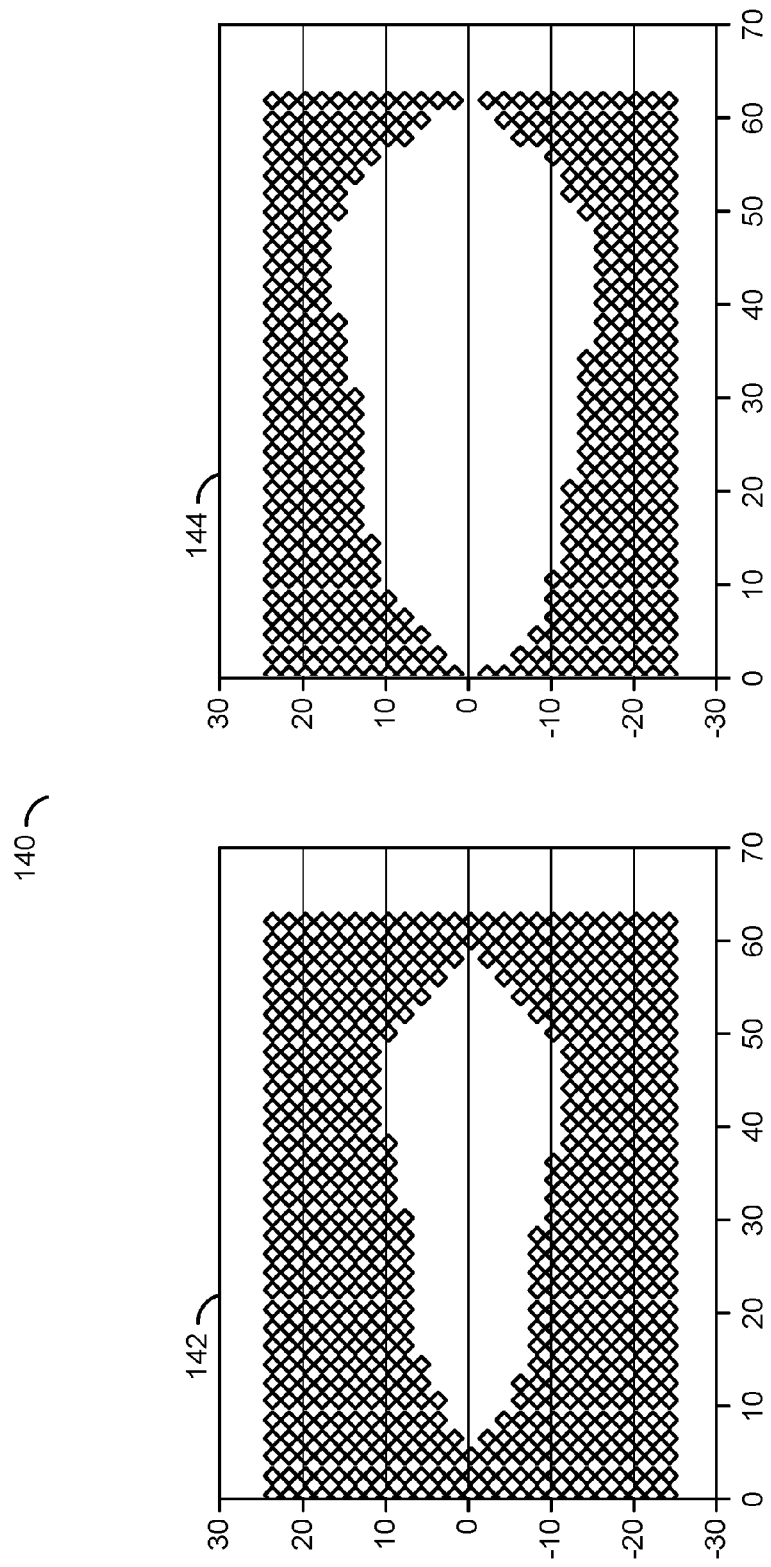
FIG. 7 is a graph of two data-eye diagrams simulations.

Referring to FIG. 7, a graph of two data-eye diagrams 142 and 144 is shown. The data-eye diagrams 142 and 144 were based on transistor-level simulations to evaluate the 1-tap DFE performance. An x-axis may represent time. A y-axis may represent a signal voltage.

The data-eye diagram 142 generally illustrates a receiver performance without a DFE capability. The data-eye diagram 144 generally illustrates a receiver performance with the DFE capability. The graphs 144 generally shows a prominent improvement (e.g., a wider data eye) on both the x-axis (time) and the y-axis (voltage) compared with the graph 142.

In various embodiments, the DFE circuit 102 may be suitable for many issues that commonly arise in DDR4 applications. For example, transfer characteristics in a signal channel for a register buffer may vary among different customers. The programmable feature of the equalizer operation in the DFE circuit 102 generally enables data recovery from a variety of transfer characteristics and channel losses. A receiver propagation delay may be limited by a timing budget in synchronized digital designs. The short delay through the DFE circuit 102 generally has a small impact on the timing budget. Furthermore, the DFE circuit 102 does not utilize a training program from a host transmitter before normal operations may be performed. As such, a potential risk for improperly sampling initial data bits while the receiver is turning on may be eliminated.

While FIG. 3 generally shows the DFE circuit 102 in the context of the RCD circuit 100 while receiving information, copies of the DFE circuit 102 may be implemented at other locations, other data paths and/or other control paths. In some embodiments, copies of the DFE circuit 102 may be located in the data buffer circuits 90a-90n to improve the signals received from the memory controller 20 during write cycles. In various embodiments, copies of the DFE circuit 102 may be located at the other end of the data bus 30 to improve various signals generated by the memory modules 50a-50n and received by the memory controller 20. For example, the memory controller 20 may include copies of the DFE circuit 102 to equalize the read data sent in the signals DQa-DQn from the memory modules 50a-50n during a read cycle. Instances of the DFE circuit 102 may also be implemented in other circuitry within the memory modules 50a-50n.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

The functions and structures illustrated in the diagrams of FIGS. 1 to 6 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element. As used herein, the term "simultaneously" is meant to describe events that share some common time period but the term is not meant to be limited to events that begin at the same point in time, end at the same point in time, or have the same duration.

While the invention has been particularly shown and described with reference to embodiments thereof, it will be understood by those skilled in the art that various changes in form and details may be made without departing from the scope of the invention.

The invention claimed is:

1. An apparatus comprising:
   a first circuit configured to (i) receive a sequence of input values that have been carried on a single-ended line of a data bus coupled to a memory channel, (ii) slice a previous input value of said sequence of input values to generate a previous output value, (iii) slice a current input value of said sequence of input values to generate a current output value, and (iv) present said current output value on a differential line, wherein said previous input value precedes said current input value in said sequence of input values; and
   a second circuit configured to decode said previous input value based on a tap coefficient value to generate a plurality of feedback values suitable to reduce an inter-symbol interference in said current input value caused by said previous input value.

2. The apparatus according to claim 1, wherein (i) said second circuit comprises a single-tap decision-feedback equalizer (DFE) circuit and (ii) said tap coefficient value is programmable.

3. The apparatus according to claim 1, further comprising a third circuit configured to subtract an equalization value from said current input value prior to said input value being received by said first circuit.

4. The apparatus according to claim 3, wherein said third circuit comprises a differential amplifier that receives said sequence of input values at a first gate of a first transistor and a reference voltage at a second gate of a second transistor.

5. The apparatus according to claim 3, further comprising a fourth circuit configured to generate said equalization value by amplifying said feedback values.

6. The apparatus according to claim 5, wherein (i) each of said feedback values is carried by a respective differential signal having a positive component and a negative component and (ii) said fourth circuit comprises (a) a first plurality of transistors connected in parallel to a first transistor of said third circuit and controlled by said positive components of said feedback values and (b) a second plurality of transistors connected in parallel to a second transistor of said third circuit and controlled by said negative components of said feedback values.

7. The apparatus according to claim 5, wherein a delay through said fourth circuit and said first circuit is at most 100 picoseconds.

8. The apparatus according to claim 1, wherein said second circuit comprises a delay circuit configured to delay said previous output value by a clock cycle.

9. The apparatus according to claim 8, wherein said second circuit further comprises a multiplication circuit configured to multiply said previous output value by said tap coefficient value to generate said feedback values.

10. The apparatus according to claim 1, wherein said data bus is an address/command bus of a double data rate (DDR) memory module.

11. The apparatus according to claim 10, wherein said DDR memory module comprises a double data rate fourth generation (DDR4) dual in-line memory module (DIMM).

12. The apparatus according to claim 1, wherein said apparatus implements a registered clock driver (RCD) circuit.

13. The apparatus according to claim 12, wherein said RCD circuit is at least double data rate fourth generation (DDR4) compliant.

14. The apparatus according to claim 1, wherein said memory channel comprises a plurality of dynamic random access memory (DRAM) chips.

15. A method for single-ended signal equalization, comprising the steps of:
   receiving at a circuit a sequence of input values that have been carried on a single-ended line of a data bus connected between a memory channel and a memory controller;
   slicing a previous input value of said sequence of input values to generate a previous output value;
   slicing a current input value of said sequence of input values to generate a current output value, wherein said previous input value precedes said current input value in said sequence of input values;
   presenting said current output value on a differential line; and
   decoding said previous input value based on a tap coefficient value to generate a plurality of feedback values suitable to reduce an inter-symbol interference in said current input value caused by said previous input value.

16. The method according to claim 15, wherein (i) said previous input value is decoded using a single-tap decision-feedback equalizer (DFE) circuit and (ii) said tap coefficient value is programmable.

17. The method according to claim 15, further comprising the step of:
   generating an equalization value by amplifying said feedback values.

18. The method according to claim 17, further comprising the step of:
   subtracting said equalization value from said current input value prior to being received by said circuit.

19. The method according to claim 15, wherein said previous input value is decoded by delaying said previous output value by a clock cycle.

20. The method according to claim 19, wherein said previous input value is further decoded by multiplying said previous output value by said tap coefficient value to generate said feedback values.

\* \* \* \* \*